United States Patent [19]

Sliwa et al.

[11] Patent Number: 4,577,398
[45] Date of Patent: Mar. 25, 1986

[54] METHOD FOR MOUNTING A SEMICONDUCTOR CHIP

[75] Inventors: John W. Sliwa, Los Altos Hills; Roy J. Burt, Sunnyvale; Chune Lee, San Francisco; John MacKay, Saratoga; Cindy A. Johnson, Sunnyvale, all of Calif.

[73] Assignee: Trilogy Computer Development Partners, Ltd., Cupertino, Calif.

[21] Appl. No.: 648,570

[22] Filed: Sep. 7, 1984

[51] Int. Cl.⁴ .............................................. H01L 23/12
[52] U.S. Cl. ........................................ 29/590; 29/831; 29/589; 357/80; 357/81
[58] Field of Search ................. 29/589, 590, 831, 843; 357/80, 81; 228/123, 59; 174/52 R

[56] References Cited

U.S. PATENT DOCUMENTS

| | | |
|---|---|---|
| 3,399,332 | 8/1968 | Savolainen .......................... 357/81 |
| 4,139,859 | 2/1979 | Lewis et al. ...................... 357/81 X |
| 4,203,127 | 5/1980 | Tegge ............................... 357/81 X |
| 4,209,347 | 6/1980 | Klein ................................ 357/81 X |
| 4,295,151 | 10/1981 | Nyul et al. ..................... 357/81 X |
| 4,381,602 | 5/1983 | McIver ........................... 357/80 X |
| 4,445,271 | 5/1984 | Grabbe ............................... 29/589 |

Primary Examiner—Brian E. Hearn
Assistant Examiner—David A. Hey
Attorney, Agent, or Firm—Townsend & Townsend

[57] ABSTRACT

A method of attaching a semiconductor chip to a mounting surface is disclosed. A solder barrier is applied to the mounting surface, and a preform of solder is located within the solder barrier. The preform is heated and then cooled in a vacuum to preflow the solder and secure the solder to the mounting surface substantially without voids. The semiconductor chip is then placed over the preflowed solder, which is reheated and then recooled in a vacuum to secure the chip to the mounting surface.

35 Claims, 12 Drawing Figures

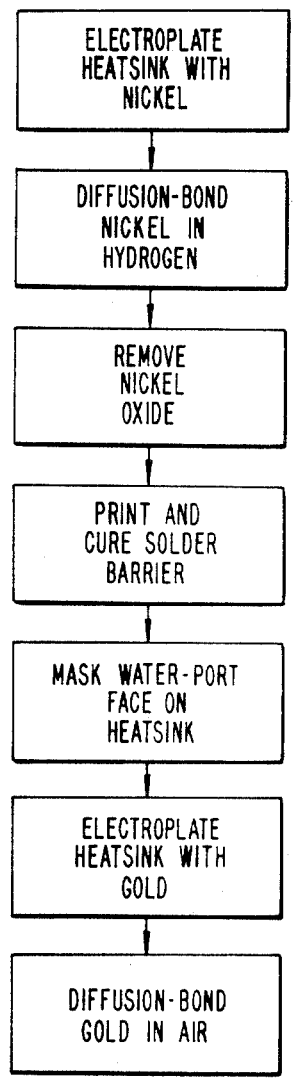
FIG._1.
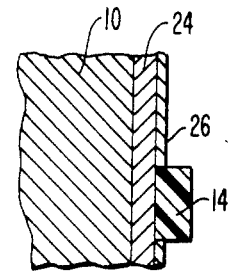
FIG._3.
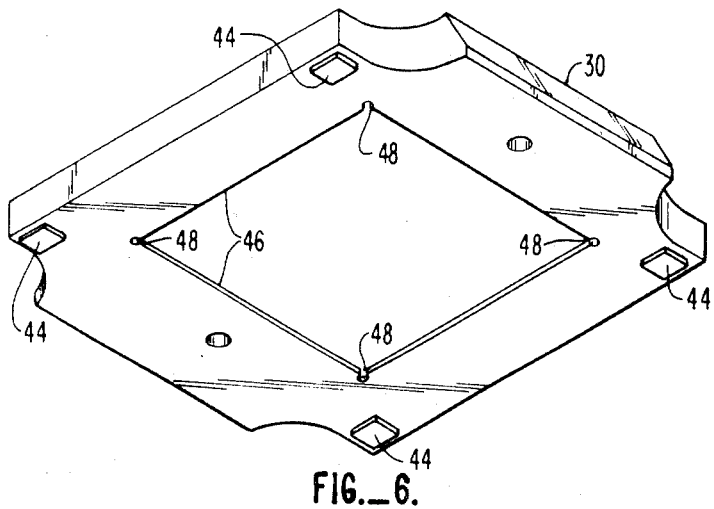
FIG._6.
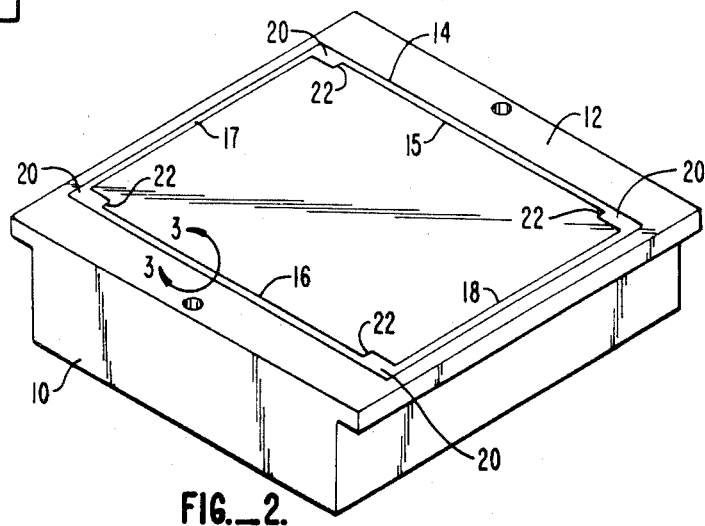
FIG._2.

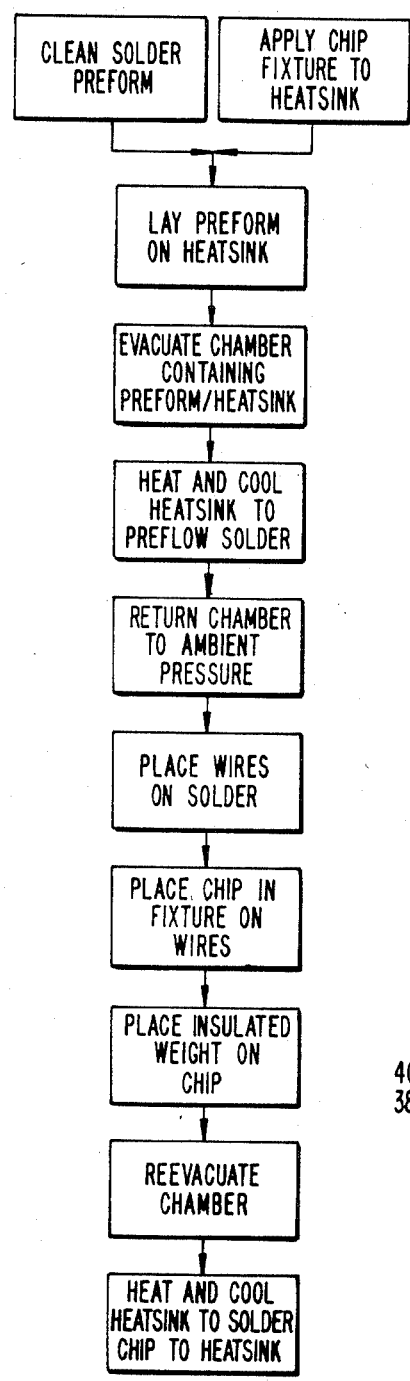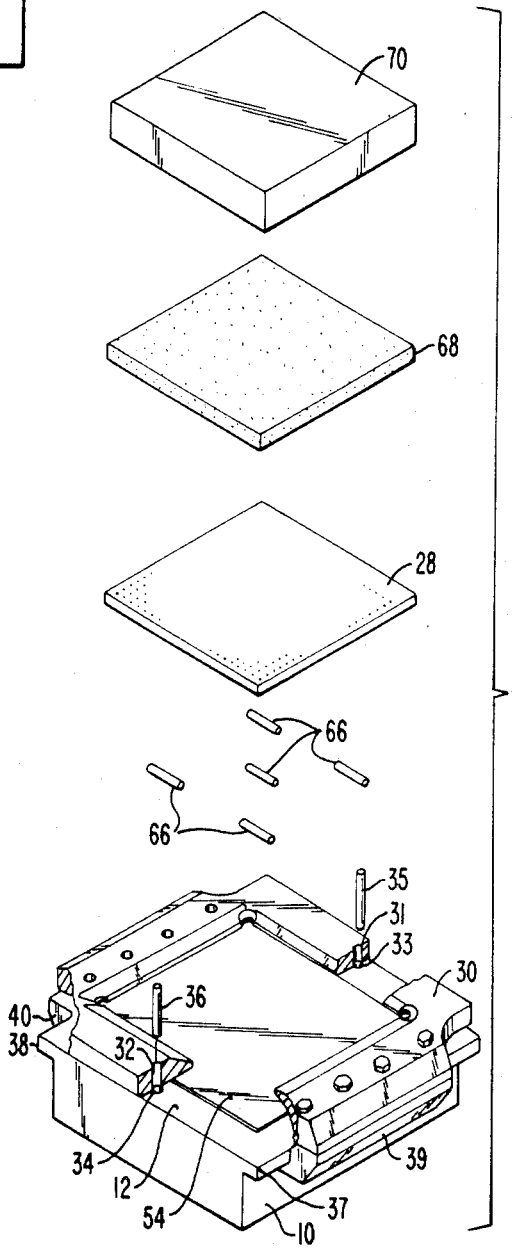
FIG._4.
FIG._9.

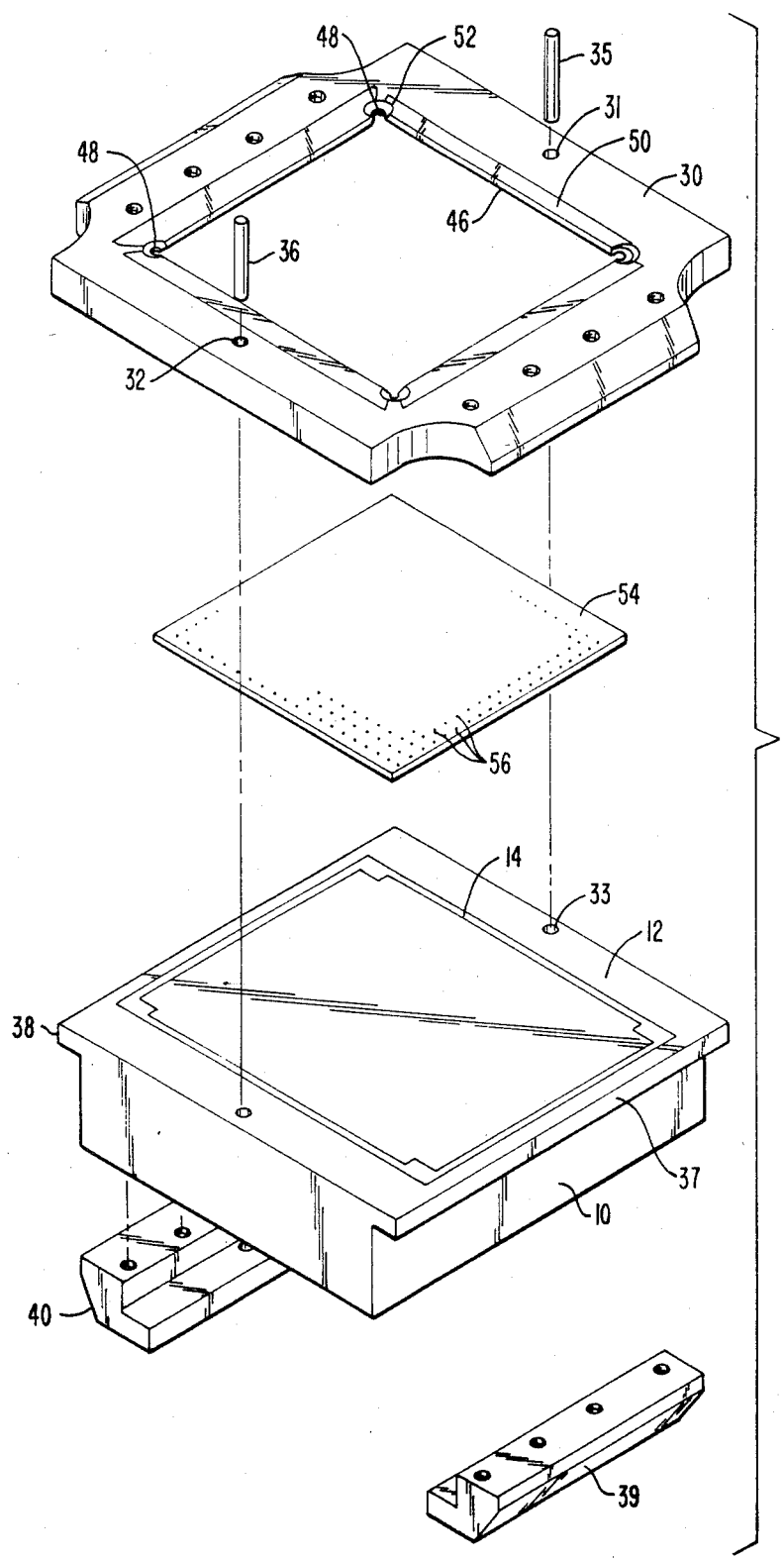
FIG._5.

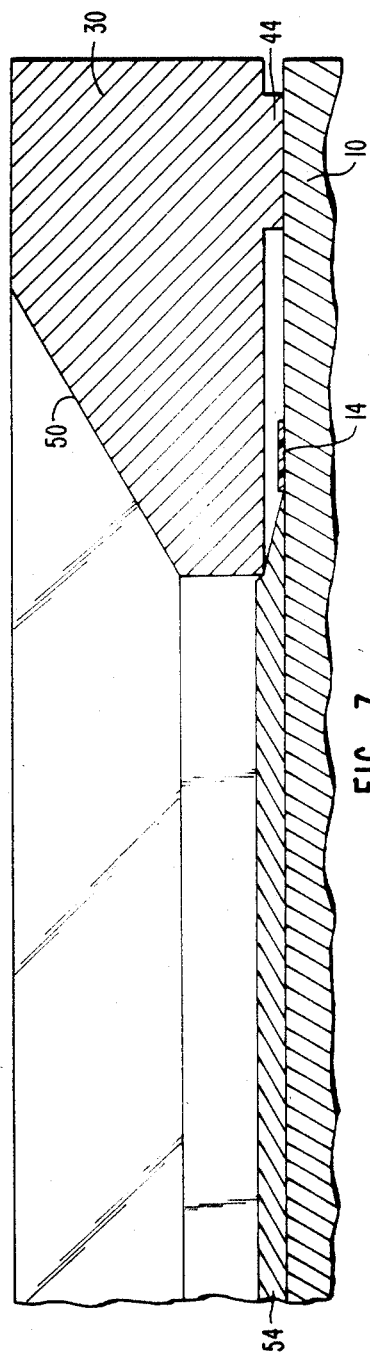
FIG._7.
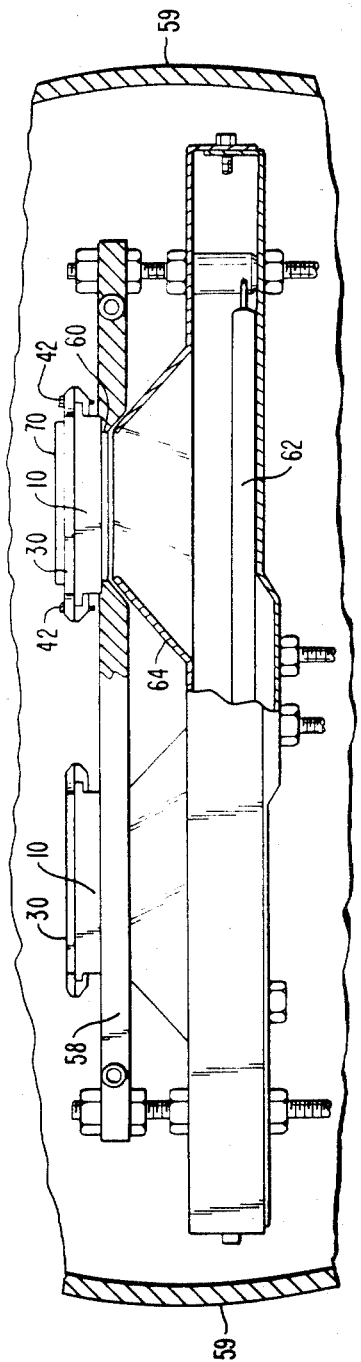
FIG._8.

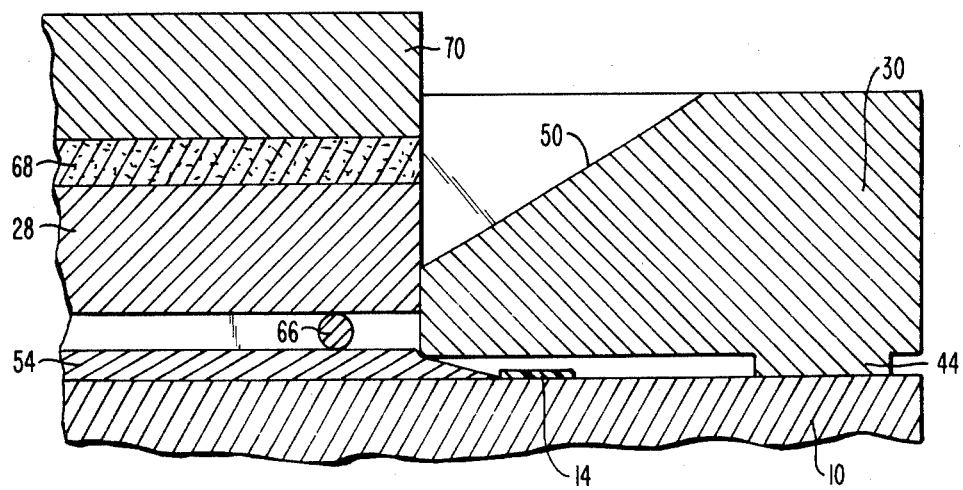
FIG._10.
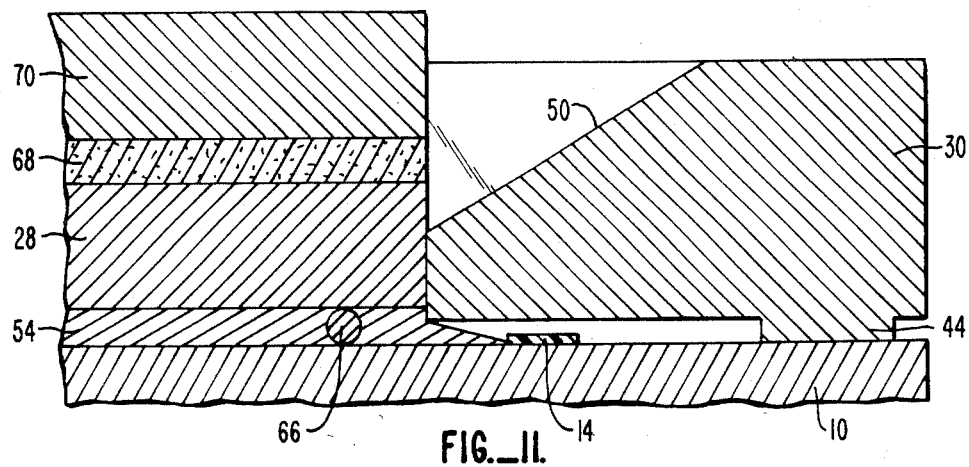
FIG._11.
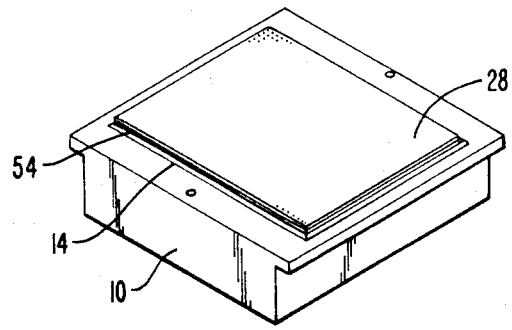
FIG._12.

METHOD FOR MOUNTING A SEMICONDUCTOR CHIP

BACKGROUND OF THE INVENTION

1. Field of the Invention

The present invention relates to a method for mechanically and thermally mounting a semiconductor chip on a support such as a heat sink.

2. Description of the Prior Art

Semiconductor die or "chips" are normally formed in multiples in a silicon wafer which is about 5 inches in diameter. The wafer is then cut into individual chips, usually no larger than about 50 square millimeters, each of which contains a large number of electronic circuit elements. Logic chips which perform arithmetic computation functions, for example the function of addition, are now in production which have more than 40,000 transistors and other circuit elements in a 50 square millimeter area.

Even with the large number of functions which can be accommodated on a single chip, a large number of such chips are required in computing systems with significant capacity. Overall system speed is limited by the necessity of transmitting signals between logic circuits on different chips, and it would be desirable to increase the size of the individual chips to reduce the number of chip-to-chip communications, and thus increase system speed. Large size chips have not been effectively implemented for a variety of reasons, among which is the difficulty in adequately mounting such a chip to a supporting structure. Such difficulties are multiplied when the size of the chips is increased to "wafer-scale" having dimensions on the order of 60×60 millimeters.

Semiconductor chips are typically mounted to a supporting structure by solder. Soldering of the chip to the support in the conventional fashion results in voids in the solder which contain trapped ambient gas from the soldering environment, usually air. The chip is typically moved back and forth while the solder is molten to reduce such voids, and mechanical brushing techniques have also been tried to distribute the solder and eliminate the trapped gas. However, even when great care is taken to make the soldering attachment of a relatively small, 50 square millimeter chip, about 20% or more of the volume between the chip and the support typically constitutes gas-filled voids in the solder.

Conventional solder attachment techniques are insufficient to properly mount a wafer scale chip. A wafer scale chip requires positive cooling, as by mounting the chip directly to a heat sink, because of the heat generated by the large number of circuits. The gas-filled voids in a conventional soldered connection to a heat sink result in "hot spots" because the gas in the voids is a thermal insulator. Such a hot spot in a critical position could destroy the chip. Furthermore, it is not possible as a practical matter to apply mechanical brushing techniques or movement techniques to chips having wafer scale dimensions because such chips must be extremely accurately positioned on the support and are more prone to scrubbing damage.

SUMMARY OF THE INVENTION

The present invention provides a method of attaching a semiconductor chip, to a mounting surface. A solder barrier is applied to the mounting surface, and a preform of solder is located within the solder barrier. The preform is heated and then cooled in a vacuum to preflow the solder and secure the solder to the mounting surface substantially without voids. The semiconductor chip is then placed over the preflowed solder, which is reheated and then recooled in a vacuum to secure the chip to the mounting surface.

Preflowing the solder in a vacuum removes trapped gases to avoid the formation of pockets which can result in hot spots when heat transfer to the mounting surface is used to cool the chip. This feature is especially advantageous in the mounting of large, wafer scale chips where the mounting surface is part of a heat sink. The removal of trapped gas is facilitated if the solder preform has a plurality of apertures, which disappear during the preflow operation but allow trapped gas to escape in the meantime. The chip can be precisely located on the solder and maintained in position during vacuum reheating and recooling. Movement of the chip is not necessary to remove voids because no gases are present either in the preform or in the ambient and only highly wettable oxide-free surfaces are present.

It is preferred that both the solder preform and the chip be located by a jig, which is spaced from the mounting surface so that excess solder can be accommodated. The chip itself is preferably accurately spaced from the mounting surface by wires placed lengthwise over the preflowed solder. The wires sink into the solder when it is reheated, the diameter of the wire employed providing the desired solder spacing between the chip and the mounting surface. The chip is forced downwardly during the reheating of the solder by a weight which is thermally insulated from the chip so that rapid heat loss does not occur through the chip, which could result in premature and localized hardening of the solder.

The novel features which are characteristic of the invention, as to organization and method of operation, together with further objects and advantages thereof will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a block diagram of the heat sink preparation portion of the preferred embodiment of the present invention;

FIG. 2 is a perspective view of the prepared heat sink;

FIG. 3 is an enlarged fragmentary section view taken along lines 3—3 of FIG. 2;

FIG. 4 is a block diagram of the chip attachment portion of the preferred embodiment of the present invention;

FIG. 5 is an exploded view of the heat sink and fixture illustrating the placement of the preform;

FIG. 6 is a bottom perspective view of the fixture utilized in the preferred embodiment;

FIG. 7 is an enlarged, fragmentary view illustrating the solder preform secured to the heat sink;

FIG. 8 is an elevation view of the frame used in the heating of the solder;

FIG. 9 is an exploded view of the attachment of the chip to the heat sink using the preflowed solder;

FIG. 10 is an enlarged fragmentary elevation view of the chip in position before the preflowed solder is reheated;

FIG. 11 is a view similar to that of FIG. 10 after the solder has been reheated;

FIG. 12 is a perspective view of the completed attachment of the chip to the heat sink.

DESCRIPTION OF THE PREFERRED EMBODIMENT

The initial stage of the preferred embodiment of the subject invention is to prepare the mounting surface, as described in FIG. 1 and illustrated in FIGS. 2 and 3. Molybdenum heat sink 10 has a mounting surface 12, and the entire heat sink including the mounting surface is electroplated with nickel to a thickness of approximately 300 microinches. The heat sink with the plated nickel is then heated to approximately 700° C. in a hydrogen atmosphere so that the nickel and molybdenum interdiffuse. Any nickel oxide which has formed is then removed, and a high temperature epoxy solder barrier 14 is printed and cured on mounting surface 12. Edges 15, 16 of solder barrier 14 are located so that they will be spaced approximately 70 mils each from the chip when the chip is placed within the solder barrier, and edges 17, 18 of the barrier are located so that they will be spaced approximately 300 mils from the chip. Solder barrier 14 has rectangular portions 20 in the corners, having edges 22 spaced 90 mils from the chip when the chip is located within the solder barrier.

The top surface of heat sink 10, which is opposite from mounting surface 12 and which appears as the bottom surface with the heat sink in the inverted position illustrated in FIG. 2, is then masked using an adhesive tape. Heat sink 10 is then electroplated with gold to a thickness of approximately 50-80 microinches, except for the masked top and solder barrier 14 to which the gold does not adhere during the electroplating operation. Heat sink 10 with the nickel layer and the electroplated gold layer is then heated to approximately 350° C. in air to diffusion bond the gold to the nickel. The final configuration of the surface of heat sink 10, as illustrated in FIG. 3, includes the basic molybdenum heat sink covered by diffusion bonded nickel 24 and diffusion bonded gold 26 except at solder barrier 14. While FIG. 3 illustrates the layers as discrete the diffusion bonding actually blurs the borders between the layers.

After preparation of the heat sink, a semiconductor chip 28 about 62 mm. square is attached to the heat sink, as described in FIG. 4 and illustrated in the remaining figures. A molybdenum fixture or jig 30 having a thin non-solder wettable coating such as titanium if necessary has a pair of apertures 31, 32 which correspond with drilled holes 33, 34 in the mounting surface 12 of heat sink 10 (FIG. 5). Fixture 30 is placed on mounting surface 12 so that apertures 31, 32 are in registration with holes 33, 34, and dowels 35, 36 are inserted to hold the fixture precisely in its desired position. Heat sink 10 has lateral flanges 37, 38, and clamping members 39, 40 extend beneath the flanges. Clamping members 39, 40 are screwed to fixture 30 using screws 42 (FIG. 8) to hold the fixture in position.

As illustrated in FIG. 6, fixture or jig 30 has four rectangular pads 44 on its bottom surface. Pads 44 have a thickness of 3½ mils to provide a three mil spacing between the underside of fixture 30 and mounting surface 12 (FIG. 7).

Fixture or jig 30 includes an interior border 46 having dimensions slightly larger than the chip size, generally on the order of 0.001-0.005 inches depending on placement accuracy. Small circular cut-outs 48 are provided in each corner of the border. The upper surface of fixture 30 is provided with a chamfer 50 terminating in border 46, and cut outs 48 each have an additional depression 52. Chamfer 50 facilitates insertion of the preform and chip, as illustrated hereinafter, and cut outs 48 allow the efflux of excess solder.

Preform 54 comprises a sheet of 60% indium/40% lead solder which is about 62 by 62 millimeters square, the dimensions of chip 28. The indium/lead solder begins to melt at about 195° C., and becomes fully molten at about 225° C., giving it a melting temperature range of about 195°-225° C. Preform 54 has a thickness of about 0.0055 inches, which is typically 0.001 to 0.0015 inches thicker than the final desired solder boundline thickness when chip 28 has been secured to the heat sink. Preform 54 has a rectangular array of apertures 56, typically 0.02 inch in diameter spaced from one another by about 0.12 inches. Preform 54 is initially cleaned in a series of conventional solvents to remove organic residue and other matter which might contaminate the eventual solder connection. Depending on the degree of oxidation of the preform, a plasma or sputter-etching preclean may be substituted or done in addition. Argon sputter pre-cleaning or hydrogen plasma cleaning work well. The preform is then inserted within border 46 of fixture 30 overlying the mounting surface 12 of heat sink 10, as illustrated in FIG. 5. Preform 54 will be spaced approximately 70 mils from the near edges 15, 16 of solder barrier 14, and approximately 300 mils from the far inside edges 17, 18 of the solder barrier.

Heat sink 10, with fixture 30 attached, is mounted to a frame 58 (FIG. 8) in a vacuum chamber 59. Frame 58 contains multiple openings 60 in which several heat sinks can be located for simultaneous processing. Radiant heaters 62 are located beneath frame 58, and reflective surface 64 overlies radiant heater 62 and extends to openings 60. When radiant heaters 62 are in operation, heat sinks 10 are heated at the surface opposite from the mounting surface 12, this being normally the top surface. This surface was not plated with gold but only with nickel, giving it a low reflectivity so that it is efficiently heated by radiant heaters 62.

The vacuum chamber in which frame 58 is located is evacuated to the low $10^{-6}$ torr range, and radiant heaters 62 activated to heat each heat sink 10. The solder preform 54 located within each fixture 30 is heated by conduction through its associated heat sink. The heating is controlled so that the solder preform 54 reaches the lower bound (195° C.) of its melting temperature range quickly, passes through its temperature range slowly to slightly above its upper bound (225° C.), and after the temperature peaks the temperature is dropped back to ambient temperature as quickly as possible.

During this initial heating step, preform 54 preflows, filling in the apertures originally contained in the preform, as illustrated in FIG. 7. Essentially all of the gasses are removed as the heating takes place under vacuum, and their removal is facilitated by the original perforation in the preform. The solder will flow laterally to a certain degree but such lateral movement will be limited by solder barrier 14. Because solder barrier 14 is not wetable by the solder, the solder will merely flow to the base of the solder barrier and then stop.

The vacuum chamber is returned to ambient pressure, and a plurality of spacer wires 66 are laid lengthwise on top of preflowed solder 54. Wires 66 have a diameter of 0.0045 inch. Chip 28 is then laid over wires 66, within the border 46 of fixture 30 (see FIG. 10). A thermally insulative pad 68 of silicone material is placed over chip 28, and a weight 70 placed on the pad. Weight 70 weighs approximately 150 grams to achieve the desired downward force on chip 28.

The chamber containing frame 58 is then re-evacuated to the low $10^{-6}$ torr level. Radiant heaters 62 are then actuated, to bring solder 54 rapidly to the lower bound of its melting temperature range and then slowly through the range to slightly above the upper bound. Wires 66, which are typically copper or any other metal which is heat conductive and wetable to the solder, sink into the solder layer, as illustrated in FIG. 11. Chip 28 is forced downwardly into contact with solder 54, and is maintained approximately 0.0045 inches from mounting surface 12 by wires 66. Excess solder escapes through cut-outs 48. Unwanted rapid heat loss through weight 70 is prevented by pad 68. Radiant heaters 62 are then turned off and the system cooled so that chip 28 is firmly fixed to mounting surface 12 by intervening solder 54 having a boundline thickness of 0.0045 inches. Because of the vacuum preflow and reflow procedures, and the use of the fixture, the solder connection will be made essentially without voids, and the chip will be precisely located relative to the heat sink. The final configuration of chip 28 attached to the mounting surface 12 of heat sink 10 by solder 54 is illustrated in FIG. 12.

While a preferred embodiment of the present invention has been illustrated in detail, it is apparent that modifications and adaptations of that embodiment will appear to those skilled in the art. However, it is to be expressly understood that such modifications and adaptations are within the spirit and scope of the present invention, as set forth in the following claims.

What is claimed is:

1. A method for attaching a semiconductor chip to a mounting surface comprising the step of:
   applying a solder barrier to the mounting surface;
   placing a prefrom of solder within the solder barrier;
   heating and then cooling the preform in a vacuum to preflow the solder and secure the solder to the mounting surface substantially without voids;
   locating the simconductor chip overlying the preflowed solder; and
   reheating and then recooling the solder in a vacuum to secure the semiconductor chip to the mounting surface with the intervening solder.

2. A method for attaching a semiconductor chip to a mounting surface comprising the step of:
   applying a solder barrier to the mounting surface;
   securing a jig having a interior border conformed to the exterior dimensions of the semiconductor ship to the mounting surface;
   placing a preform of solder within the interior border of the jig, the perform having exterior dimensions substantially equal to those of the semiconductor chip;
   heating and then cooling the preform in a vacuum to preflow the solder and secure the solder to the mounting surface substantially without voids;
   locating the semiconductor chip overlying the preflowed solder within the interior border of the jig;
   reheating and then recooling the solder in a vacuum to secure the semiconductor chip to the mounting surface with the intervening solder; and
   spacing the semiconductor chip a preselected distance from the mounting surface during the reheating and then recooling step.

3. The method of claim 2 wherein said spacing step comprises placing wires lengthwise between the chip and the preflowed solder prior to the reheating and recooling step, and wherein the reheating and recooling step includes allowing the wires to settle into the solder so that the chip is spaced from the mounting surface by the diameter of the wires.

4. The method of claim 3 and additionally comprising placing a weight overlying the chip during the reheating and recooling step.

5. The method of claim 4 and additionally comprising insluating the weight from the chip to prevent rapid heat loss through the chip during the reheating and recooling step.

6. A method for attaching a semiconductor chip to the mounting surface of a molybdenum heat sink comprising the steps of:
   plating the mounting surface with nickel and diffusion bonding the nickel to the mounting surface in a hydrogen environment;
   thereafter printing and curing an epoxy solder barrier on the mounting surface;
   thereafter plating a gold layer overlying the nickel layer and diffusion bonding the gold to the nickel and to the mounting surface;
   placing a preform of solder within the solder barrier;
   heating and then cooling the preform in a vacuum to preflow the solder and secure the solder to the mounting surface substantially without voids;
   locating the semiconductor chip overlying the preflowed solder; and
   reheating and then recooling the solder to in a vacuum secure the semiconductor chip to the mounting surface with the intervening solder.

7. A method for attaching a semiconductor chip to a mounting surface comprising the steps of:
   applying a solder barrier to the mounting surface;
   placing a preform of solder on the mounting surface;
   heating and then cooling the preform in a vacuum to preflow the solder and secure the solder to the mounting surface substantially without gas-filled voids;
   placing spacing means wetable to the solder and having a preselected thickness equal to the desired bondline thickness on the preflowed solder;
   placing the semiconductor chip on the spacing means;
   placing the thermally insulated weight on the semiconductor chip; and
   reheating and then recooling the solder in a vacuum so that the spacing mens settle into the solder and the semiconductor chip is secured to the mounting surface with the intervening solder, the bondline thickness of the solder being equal to thickness of the spacing means.

8. The method of claim 7 wherein the spacing means comprise a plurality of discrete wires placed lengthwise on the preflowed solder and having a diameter equal to the desired bondline thickness.

9. The method of claim 2 or 7 and additionally comprising applying a solder barrier to the mounting surface prior to the preform placing step.

10. The method of claim 9, wherein the solder barrier applying step includes applying a solder barrier of epoxy material which is not wetable by the solder.

11. The method of claim 9, wherein the solder barrier applying steps comprises printing a curing a solder barrier on the mounting surface.

12. The method of claim 6, or 7 and additionally comprising securing a jig having an interior border conformed to the exterior dimensions of the semiconductor chip to the mounting surface prior to the preform placing step.

13. The method of claim 12 and additionally comprising spacing the jig from the mounting surface a distance slightly less than the thickness of the preform.

14. The method fo claim 1, 2, 6 or 7 wherein the heating and reheating steps include heating the mounting surface to heat the solder by conduction.

15. The method of claim 14 wherein the mounting surface is located to on a heat sink having a back surface opposite from the mounting surface, and wherein the heating and reheating steps each comprise radiantly heating the back surface of the heat sink.

16. The method of claim 1, 2, 6 or 7 wherein the heating step is performed in a vacuum of at least about $10^{-6}$ torr.

17. The method of claim 1, 2, 6, or 7 wherein the heating and then cooling step includes rapidly bringing the perform to the lower boundary of its melting temperature range, raising the temperature slowly through the melting temperature range to preflow the solder, and then cooling the preflowed solder to ambient.

18. The method of claim 1, 2, 6, or 7 wherein the reheating and then recooling step comprises rapidly heating the solder to the lower boundary of its melting temperature range, raising the temperature of the solder slowly through its melting temperature range to melt the solder, and then cooling the solder to ambient temperature.

19. A method for attaching a semiconductor chip to the mounting surface of a thermally conductive body comprising the step of:
applying a solder barrier to the mounting surface;
securing a jig having an interior border conformed to the exterior dimensions of the semiconductor chip to the mounting surface;
placing the body in a vacuum chamber overlying a radiant heater unit with the mounting surface and secured jig facing upwardly;
placing a preform of solder within the interior border of the jig;
evacuating the vacuum chamber;
actuating the radiant heater unit to heat the thermally conductive body and the preform of solder located thereon to preflow the solder, and then deactuating the radiant heater unit to cool the solder and secure the solder to the mounting surface;
placing the semiconductor chip overlying the preflowed solder; and
reactuating the radiant heater unit to heat the thermally conductive body and the solder located thereon and then deactuating the radiant heater unit to secure the semiconductor chip to the mounting surface with the intervening solder.

20. The method of claim 19 wherein the evacuating step comprises evacuating the chamber to at least about $10^{-6}$ torr.

21. The method of claim 1, 6 or 19 and additionally comprising spacing the semiconductor chip a fixed distance from the mounting surface during the reheating and recooling step.

22. The method of claim 21 wherein said spacing step comprises placing wires lengthwise between the chip and the preflowed solder prior to the reheating and recooling step, and wherein the reheating and recooling step includes allowing the wires to settle into the solder so that the chip is spaced from the mounting surface by the diameter of the wires.

23. The method of claim 22 and additionally comprising placing a weight overlying the chip during the reheating and recooling step.

24. The method of claim 23 and additionally comprising insulating the weight from the chip to prevent rapid heat loss through the chip during the reheating and recooling step.

25. The method of claim 1, 2, 6, 7 or 19 wherein the preform has a plurality of apertures, and wherein the heating and then cooling step includes preflowing the solder to fill in the apertures while the apertures allow for the escape of gas to minimize the formation of gas-filled voids.

26. A method for attaching a semiconductor chip to a mounting surface of a heat sink comprising the steps of:
applying a solder barrier to the mounting surface;
securing a jig having an interior border conformed to the exterior of the semiconductor chip to the mounting surface;
placing the heat sink in a vacuum chamber overlying a radiant heater unit with the mounting surface and jig facing upwardly;
placing a preform of solder having a plurality of apertures within theinterior border of the jig;
evacuating the vacuum chamber to at least about $10^{-6}$ torr;
actuating the radiant heater unit to heat the heat sink and the preform located thereon to preflow the solder and fill in the apertures, and then deactuating the radiant heater unit to secure to solder to the mounting surface substantially without voids;
placing spacing means on the preflowed solder having a thickness equal to the desired bondline thickness of thes solder after attachment of the semiconductor chip;
placing the semiconductor chip on the spacing means;
placing a thermally insulated weight on top of the semiconductor chip; and
reactuating the radiant heater unit to heat the heat sink and the solder attached thereto to melt the solder so that the spacing means settle into the solder, and then deactuating the radiant heater unit to secure the semiconductor chip to the mounting surface with the intervening solder.

27. The method of claim 19 or 26 and additionally comprising the steps of removing the vacuum subsequent to the actuating step, and re-evacuating the chamber prior to the reactuating step.

28. The method of claim 27 wherein the re-evacuating step comprises re-evacuating the chamber to a vacuum of at least about $10^{-6}$ torr.

29. The method of claim 19 or 26 wherein the actuating step includes rapidly heating the preform to the lower boundary of its forming temperature range, and then slowly raising the temperature of the preform through its melting temperature range.

30. The method of claim 19 or 26 wherein said reactuating step includes rapidly heating the solder to the lower boundary of its melting temperature range, and then slowly raising the temperature of the solder through its melting temperature range 31. The method of claim 1, 19 or 26 and additionally comprising allowing excess solder to escape from within the solder barrier in a direction normal to mounting surface.

32. The method of claim 1, 3, 19 or 26 wherein the solder barrier applying step includes applying a solder barrier of epoxy material which is not wetable by the solder.

33. The method of claim 1, 3, 19 or 26 wherein the solder barrier applying step comprises printing and curing a solder barrier on the mounting surface.

34. The method of claim 1, 2, 7, 19 or 26 and additionally comprising:
 plating the mounting surface with nickel;
 heating the mounting surface and plated nickel in hydrogen enviornment to diffusion bond the nickel to the mounting surface;
 plating a gold layer overlying the nickel layer; and
 heating the mounting surface, plated nickel and plated gold to diffusion bond the gold to the nickel and to the mounting surface.

35. The method of claim 1, 2, 6, 7, 19 or 26 wherein the chip has an area of about 3600 mm$^2$.

* * * * *